(12) United States Patent
Kawamoto et al.

(10) Patent No.: US 12,183,542 B2
(45) Date of Patent: Dec. 31, 2024

(54) TRANSMISSION ELECTRON MICROSCOPE AND IMAGING METHOD (71) Applicant: Hitachi High-Tech Corporation, Tokyo (JP)

(72) Inventors: Hiroki Kawamoto, Tokyo (JP); Keiji Tamura, Tokyo (JP); Toshie Yaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 409 days.

(21) Appl. No.: 17/638,695

(22) PCT Filed: Aug. 27, 2019

(86) PCT No.: PCT/JP2019/033481
§ 371 (c)(1),
(2) Date: Feb. 25, 2022

(87) PCT Pub. No.: WO2021/038715
PCT Pub. Date: Mar. 4, 2021

(65) Prior Publication Data
US 2022/0359153 A1  Nov. 10, 2022

(51) Int. Cl.
*H01J 37/28* (2006.01)
*H01J 37/073* (2006.01)
(Continued)

(52) U.S. Cl.
CPC ............ *H01J 37/28* (2013.01); *H01J 37/073* (2013.01); *H01J 37/224* (2013.01); *H01J 37/244* (2013.01); *H01J 2237/31711* (2013.01)

(58) Field of Classification Search
CPC ..... H01J 2237/24455; H01J 2237/2802; H01J 2237/31711; H01J 2237/24495;
(Continued)

(56) References Cited

U.S. PATENT DOCUMENTS

2004/0061053 A1  4/2004  Taniguchi et al.
2010/0133433 A1  6/2010  Tanimoto et al.
(Continued)

FOREIGN PATENT DOCUMENTS

JP      5-47333 A     2/1993
JP      6-310076 A    11/1994
(Continued)

OTHER PUBLICATIONS

International Search Report (PCT/ISA/210) issued in PCT Application No. PCT/JP2019/033481 dated Nov. 12, 2019 with English translation (four (4) pages).
(Continued)

*Primary Examiner* — David E Smith
*Assistant Examiner* — Hsien C Tsai
(74) *Attorney, Agent, or Firm* — Crowell & Moring LLP (57) ABSTRACT

The invention is to simplify operations performed when imaging an electron diffraction pattern by using a transmission electron microscope. As a solution to the problem, a transmission electron microscope includes a detector to which an electron diffraction pattern is projected, a mask for zero-order wave configured to be inserted into and pulled out from between a sample and the detector, and a current detector configured to be inserted into and pulled out from a detection region of the zero-order waves in a state where the mask is inserted. An amount of current of electron beams emitted to the mask is measured in real time, and the measurement result is automatically reflected in settings of imaging conditions of an imaging camera provided in the transmission electron microscope.

12 Claims, 8 Drawing Sheets

(51) Int. Cl.
*H01J 37/22* (2006.01)
*H01J 37/244* (2006.01)

(58) Field of Classification Search
CPC ........ H01J 2237/14; H01J 37/28; H01J 37/10;
H01J 37/04; H01J 37/09; H01J 37/073;
H01J 37/244; H01J 37/224; H01J 37/295
See application file for complete search history.

(56) References Cited

U.S. PATENT DOCUMENTS

2015/0034822 A1    2/2015  Reinhorn et al.
2019/0131107 A1*  5/2019  Tamaki ................. H01J 37/295

FOREIGN PATENT DOCUMENTS

| | | |
|---|---|---|
| JP | 8-111201 A | 4/1996 |
| JP | 10-40843 A | 2/1998 |
| JP | 2008-165990 A | 7/2008 |
| JP | 2017-54606 A | 3/2017 |
| JP | 2017054606 A * | 3/2017 |
| JP | 2018-98576 A | 6/2018 |
| WO | WO 02/068944 A1 | 9/2002 |
| WO | WO 2013/118111 A1 | 8/2013 |
| WO | WO 2018/0377444 A1 | 3/2018 |

OTHER PUBLICATIONS

Japanese-language Written Opinion (PCT/ISA/237) issued in PCT Application No. PCT/JP2019/033481 dated Nov. 12, 2019 (five (5) pages).

* cited by examiner

TRANSMISSION ELECTRON MICROSCOPE AND IMAGING METHOD

TECHNICAL FIELD

The present invention relates to a transmission electron microscope, and particularly to a transmission electron microscope provided with a mask for zero-order waves.

BACKGROUND ART

A transmission electron microscope is a device that emits electron beams to a sample and captures a high-magnification image (enlarged image) or an electron diffraction pattern of the sample by the electron beams transmitted through the sample. When the electron diffraction pattern is to be captured in order to examine crystal structure data (such as crystal type or lattice constant) of the sample, information relating to defects or microstructures of the sample, and the like, it is necessary to capture diffracted electron beams (diffracted radiation such as primary waves or secondary waves), but it is not necessary to capture electron beams (zero-order waves, direct radiation) which travels straight without being diffracted and reaches a fluorescent screen or an imaging unit. Further, when the zero-order waves are captured, it is difficult to capture diffracted waves having weaker intensity than the zero-order waves. Thus, it is known that a mask (spot mask, beam stopper) for cutting the zero-order waves is inserted into an irradiation region of the zero-order waves.

PTL 1 discloses that an electron diffraction pattern captured by a transmission electron microscope is filtered to remove a zero-order light component.

CITATION LIST

Patent Literature

PTL 1: JP-A-8-111201

SUMMARY OF INVENTION

Technical Problem

In crystal structure analysis of a sample using the transmission electron microscope, when the high-magnification image (enlarged image) is observed, a region for which electron diffraction is to be obtained is selected by using an aperture, a mask for cutting the zero-order waves is inserted, and an electron diffraction pattern is obtained. In that case, when an irradiation range of electron beams is narrowed by changing optical conditions, in order to make it easier to see the electron diffraction pattern in a live image, blurring occurs in diffraction spots and an accurate electron diffraction pattern cannot be obtained, and therefore, it is necessary to acquire the electron diffraction pattern under optical conditions that widen the irradiation range of the electron beams. Thus, it is necessary to adjust imaging conditions such as an exposure time or a gain of an imaging camera (CCD camera or the like) during imaging.

However, even if an attempt is made to confirm the electron diffraction pattern appearing on the fluorescent screen in order to adjust the imaging conditions of the imaging camera, it is difficult to confirm the electron diffraction pattern because the electron diffraction pattern is dark when the beams (electron beams) are spread. By increasing an exposure time of a screen camera used for obtaining the live image, it is possible to grasp the electron diffraction pattern in the live image, but followability of the screen camera deteriorates, and the work thus becomes difficult and unrealistic. Thus, it is necessary to find optimum capturing conditions by imaging while changing the exposure time and the gain of the imaging camera instead of changing the optical conditions. Such work is difficult, especially for beginners.

In order to resolve the complexity of such work, it is conceivable to provide a transmission electron microscope having a function of automatically setting the imaging conditions of the imaging camera. Nevertheless, in the transmission electron microscope described in PTL 1, since the mask for zero-order waves is not inserted, a dose of the electron beams cannot be detected, and the imaging conditions of the imaging camera cannot be automatically set as described above.

Further, when intensity of the electron beams is increased in order to confirm the electron diffraction pattern appearing on the fluorescent screen and the fluorescent screen is pulled out from the irradiation region of the electron beams in that state, a scintillator of the imaging camera may be damaged.

Other technical problems and novel characteristics will become apparent from a description of the present specification and the accompanying drawings.

Solution to Problem

The typical ones of the embodiments disclosed in the present application will be briefly described as follows.

A transmission electron microscope according to an embodiment includes a detector on which an electron diffraction pattern is projected, and a mask for zero-order waves configured to be inserted into or pulled out from between a sample and the detector, and the zero-order waves are detected in a state where the mask is inserted.

An imaging method according to an embodiment includes a step of using a transmission electron microscope including a detector on which the electron diffraction pattern is projected and a mask for zero-order waves configured to be inserted into or pulled out from between a sample and the detector, and detecting the zero-order waves in a state where the mask is inserted.

Advantageous Effect

According to the typical embodiment, operability of the transmission electron microscope can be improved. In particular, the adjustment of the imaging conditions of the transmission electron microscope can be automated.

DESCRIPTION OF EMBODIMENTS

Hereinafter, an embodiment of the invention will be described in detail with reference to the drawings. In all the drawings for describing the embodiments, members having the same functions are denoted by the same reference numerals, and repetitive description thereof will be omitted. In addition, in the embodiments, description of the same or similar parts will not be repeated in principle unless particularly necessary.

Hereinafter, a transmission electron microscope used for observing a high-magnification image (enlarged image) and used for observing an electron diffraction pattern will be described in which by detecting zero-order waves in a state where a mask for zero-order waves is inserted, complicated adjustments of imaging conditions are automatically performed and a performance of the transmission electron microscope is improved. The present embodiment is applicable to both the transmission electron microscope and a scanning transmission electron microscope. Here, a transmission electron microscope will be described as an example.

<Configuration of Transmission Electron Microscope>

Figure 1:
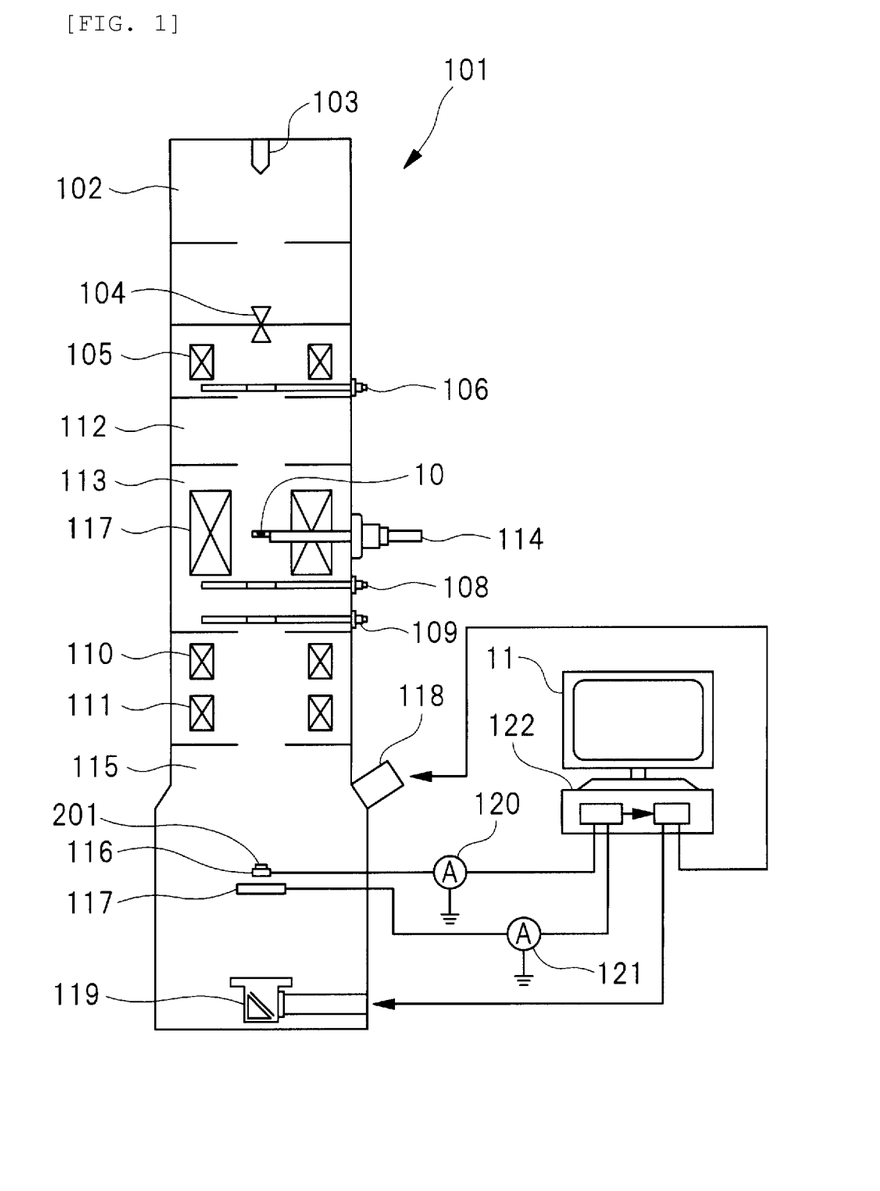
FIG. 1 is a schematic diagram illustrating a configuration of a transmission electron microscope according to an embodiment of the invention.

FIG. 1 illustrates a transmission electron microscope (TEM) 101 of the present embodiment.

The transmission electron microscope 101 includes a lens barrel 102. Inside the lens barrel 102, an electron gun 103, a gun valve 104, a condenser lens 105, a focused area aperture 106, an objective lens 107, an objective aperture 108, a selected area aperture 109, an intermediate lens 110, and a projection lens 111 which are arranged in order from an upper side to a lower side constitutes an electron beam optical system. An intermediate chamber 112 is provided below the condenser lens 105 and the focused area aperture 106, and a sample chamber 113 accommodating the objective lens 107 is provided below the intermediate chamber 112. Inside the sample chamber 113, a sample table 114 can be inserted or pulled out. On the sample table 114, a sample 10 is placed. The sample 10 is, for example, carbon black. The "insert" and "pull out" as used in the present application means insertion into or removal from an irradiation region of electron beams emitted from the electron gun 103.

Under the projection lens 111, an observation chamber 115 is provided. Inside the observation chamber 115, a mask 116, a fluorescent screen 117, and a detector (imaging unit, camera) 119 are provided in an order from the upper side to the lower side. The detector 119 is, for example, a charge coupled device (CCD) camera or a camera equipped with a complementary metal oxide semiconductor (CMOS) image sensor. The CCD camera includes a plurality of detectors arranged in an array. Thus, in the present specification, the detector 119 is referred to as a detector array 119. Nevertheless, a non-array detector, such as a film camera, may be used as the detector 119. Thus, the "detector array 119" is not limited to an array-shaped detector. The detector array 119 is provided with a scintillator on an upper portion of the detector array 119. The scintillator is formed of a material that emits light as charged particles pass therethrough. On the detector array 119, the electron diffraction pattern is projected. On a side surface of the observation chamber 115, a fluorescent screen detector array (imaging unit, camera) 118 for imaging the fluorescent screen 117 inside the observation chamber 115 is provided. The mask 116 is a beam stopper (spot mask) that can be inserted into or pulled out from a region between the sample table and the detector array, which is a detection region (irradiation region) of the zero-order waves among the electron beams emitted from the electron gun 103. The fluorescent screen 117 can be inserted into or pulled out from the irradiation region of the electron beams emitted from the electron gun 103.

On an upper surface of a portion irradiated with the zero-order waves when the mask 116 is inserted on a surface of the mask 116, a current detector 201 (for example, a Faraday cup) that is in contact with the upper surface and converts the electron beams into a current is provided. The current detector 201 and the mask 116 are connected to a current detection meter (ammeter) 120. The current detection meter 120 measures a current value of the electron beams (zero-order waves) emitted to the mask 116. The fluorescent screen 117 is connected to a current detection meter (ammeter) 121. The current detection meter 121 measures a current value of the electron beams (zero-order waves) emitted to the fluorescent screen 117.

Outside the transmission electron microscope 101, a computer (control unit) 122 is installed. The current detection meters 120 and 121 are connected to the computer 122. The fluorescent screen detector array 118 and the detector array 119 are connected to the computer 122. A display unit (monitor) 11 is connected to the computer 122. That is, the display unit is a display device installed outside the transmission electron microscope 101.

Figure 2:
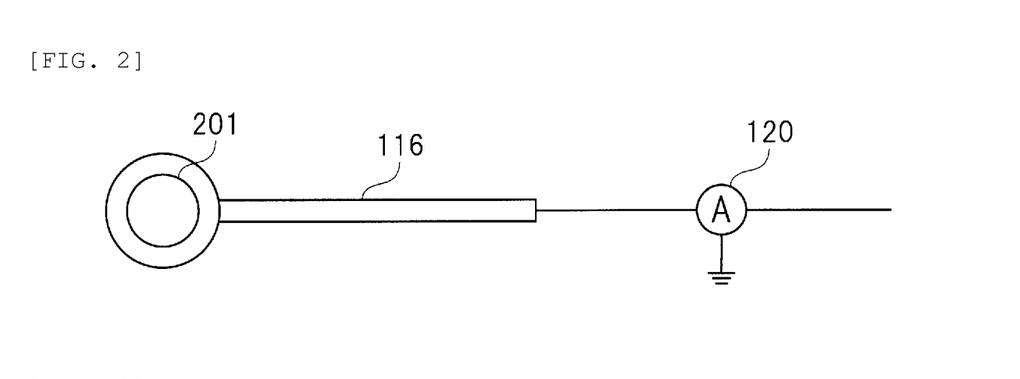
FIG. 2 is a schematic view illustrating a current detection unit constituting the transmission electron microscope according to the embodiment of the invention.
Figure 3:
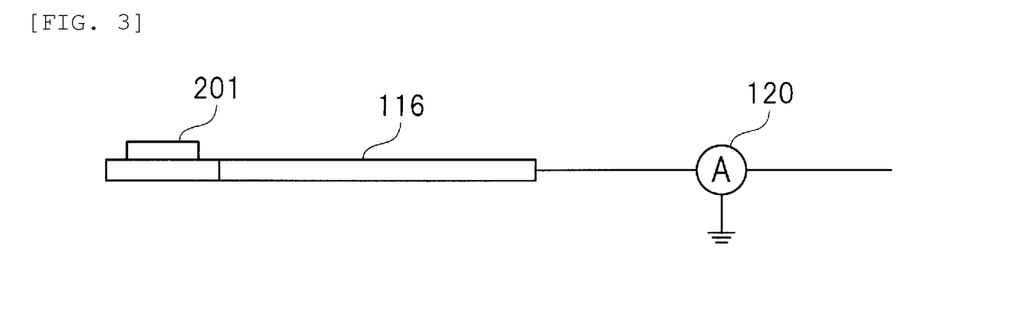
FIG. 3 is a schematic view illustrating the current detection unit constituting the transmission electron microscope according to the embodiment of the invention.

FIG. 2 illustrates a schematic view including a plan view of the mask 116, and FIG. 3 illustrates a schematic view including a side view of the mask 116. The mask 116 is used for masking (shielding) main spots (zero-order wave spots) whose electron beam intensity is higher than diffraction spots during imaging of the electron diffraction pattern. That is, the mask 116 is a mask for zero-order waves. Here, in the electron diffraction pattern imaged in dots or lines due to the irradiation of the electron beams, spots in the center generated due to the irradiation of the zero-order waves are called the main spots, and patterns generated in dots or lines due to the irradiation of diffracted waves are called the diffraction spots.

As illustrated in FIGS. 2 and 3, the mask 116 has an extending portion and a wide portion provided at one end portion of the extending portion and having a width larger than that of the extending portion in a plan view. On an upper surface of the wide portion having, for example, a circular shape in a plan view, the current detector (current detection unit) 201 is mounted in contact with the upper surface. That is, the current detector 201 is located closer to the sample 10 (see FIG. 1) than the mask 116, and is fixed to the upper surface of the mask 116. When the wide portion of the mask 116 is inserted into the detection region of the zero-order waves, the zero-order waves are emitted to an upper surface of the current detector 201. That is, in a state where the mask 116 is inserted, the zero-order waves can be detected by the current detector 201. The current detector 201 is connected to the current detection meter 120.

<Operation of Transmission Electron Microscope>

The transmission electron microscope 101 illustrated in FIG. 1 emits electron beams to the sample 10 to obtain, by the electron beams transmitted through the sample 10, a transmission image (high-magnification image (enlarged image) or electron diffraction pattern (diffraction spots)) projected onto the detector array 119.

That is, the electron beams generated from the electron gun 103 are focused by the condenser lens 105 and emitted to the sample 10. At this time, the electron beams transmitted through the sample 10 are divided into the diffracted waves whose traveling direction is changed due to the diffraction and the zero-order waves (transmission waves, direct waves) that pass through the sample 10 without causing the diffraction. The electron beams (diffracted waves and zero-order waves) transmitted through the sample 10 is imaged by the objective lens 107 and magnified by the intermediate lens 110 and the projection lens 111.

The objective aperture 108 and the selected area aperture 109 are provided on a diffraction plane and an image plane of the objective lens 107, respectively. The objective aperture 108 has a function of limiting a capture angle of diffracted electrons and scattered electrons, and the selected area aperture 109 have a function of selecting a field of view of the sample 10. That is, a location of the sample 10 (for example, in a range of several hundred nm in diameter) from which the electron diffraction pattern is obtained can be selected through the objective aperture 108 and the limited area aperture 109. This makes it possible to know the lattice constant, a lattice type or crystal orientation at a specific location of the sample 10. An enlarged transmission image of the sample 10 is projected onto the fluorescent screen 117 or the detector array 119. When the fluorescent screen 117 is inserted in the irradiation region of the electron beams, the transmission image is not projected on the detector array 119 because the electron beams are blocked by the fluorescent screen 117. The fluorescent screen 117 is a plate that emits light at a part irradiated with the electron beams. The transmission image projected on the fluorescent screen 117 can be captured by using the fluorescent screen detector array 118.

Next, a procedure for using the transmission electron microscope by an operator will be described with reference to FIGS. 4 to 7 as an imaging method using the transmission electron microscope. The transmission electron microscope can capture the high-magnification image (enlarged image) or the electron diffraction pattern, and here, an imaging method for the electron diffraction pattern will be described.

Figure 4:
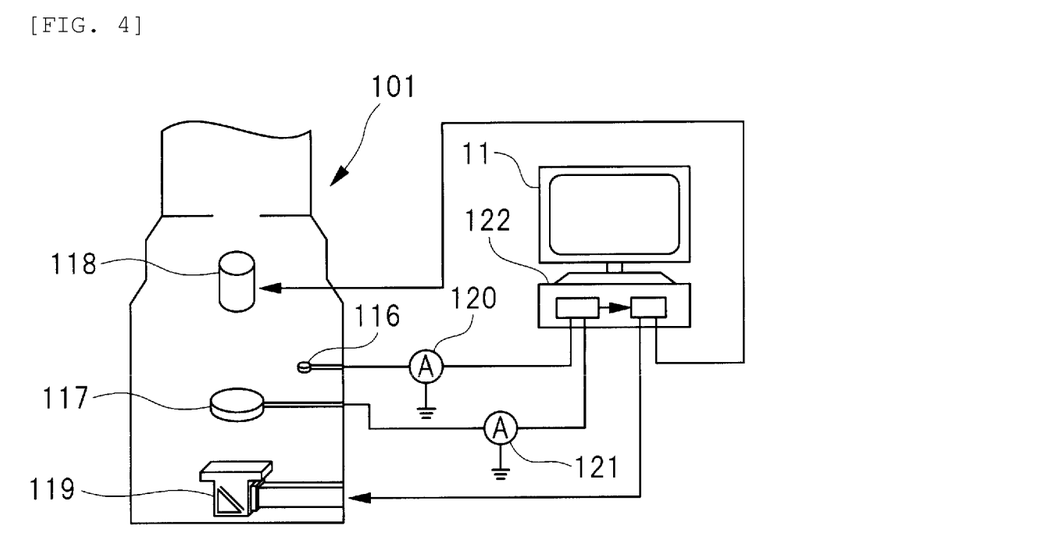
FIG. 4 is a schematic diagram illustrating a procedure for using the transmission electron microscope according to the embodiment of the invention.

During imaging of the electron diffraction pattern, first, as illustrated in FIG. 4, the electron beams are emitted from the electron gun 103 in a state where the mask 116 is pulled out from the irradiation region of the electron beams and the 117 is inserted in the irradiation region of the electron beams.

Figure 5:
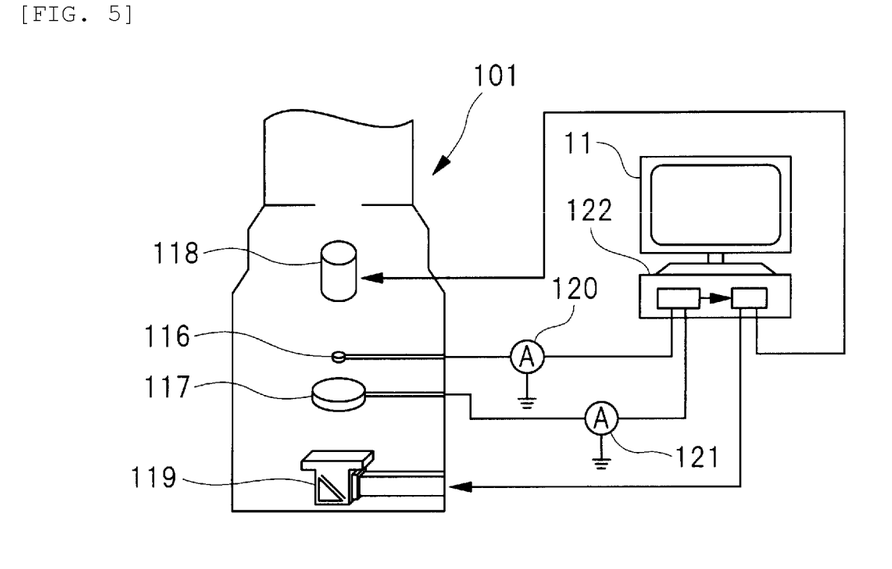
FIG. 5 is a schematic diagram illustrating a procedure for using the transmission electron microscope following FIG. 4.

Next, as illustrated in FIG. 5, by inserting the mask 116, the zero-order waves in the electron beams emitted to the fluorescent screen 117 are blocked. In the state where the mask 116 is pulled out as illustrated in FIG. 4, the intensity of the zero-order waves is much stronger than the intensity of the diffracted waves even if an attempt is made to confirm the electron diffraction pattern formed on the fluorescent screen 117, and therefore, the main spots formed by the zero-order waves are excessively bright, and it is difficult to confirm the diffraction spots (electron diffraction pattern) around the main spots. By inserting the mask 116 as illustrated in FIG. 5, it becomes possible to confirm the electron diffraction pattern by using the fluorescent screen detector array 118.

At this time, the transmitted electron beams forming the main spots are emitted onto the mask 116. That is, the transmitted electron beams are emitted onto the upper surface of the current detector 201 on the mask 116. That is, in the state where the mask 116 is inserted, the zero-order waves are hardly emitted onto either the fluorescent screen 117 or the detector array 119. Therefore, the current detection meter 120 measures a current amount (hereinafter referred to as current value) IA of the transmitted electron beams forming the main spots. The current detection meter 121 connected to the fluorescent screen 117 measures a current amount (hereinafter referred to as current value) IB of the electron beams (diffracted waves) emitted onto the fluorescent screen 117. That is, the current of the electron beams can be detected and measured by the inserted mask 116 and the fluorescent screen 117, respectively.

Next, the imaging conditions (exposure time or gain) of the fluorescent screen detector array 118 are automatically adjusted by the computer 122 based on the value of the current value IB. Subsequently, the fluorescent screen 117 is imaged by the fluorescent screen detector array 118. Here, the image captured by the fluorescent screen detector array 118 is not a still image, and the image is displayed as a live image on the display unit 11 connected to the computer 122. Subsequently, the operator of the transmission electron microscope 101 checks the live image captured by the fluorescent screen detector array 118 while adjusting, for example, a size of the captured electron diffraction pattern or a tilt angle of the sample, or adjusting optical conditions such as a magnification of the transmission electron microscope 101, a camera length, and a diameter of the aperture for adjusting a range in which the electron beam diffraction pattern is obtained.

Figure 6:
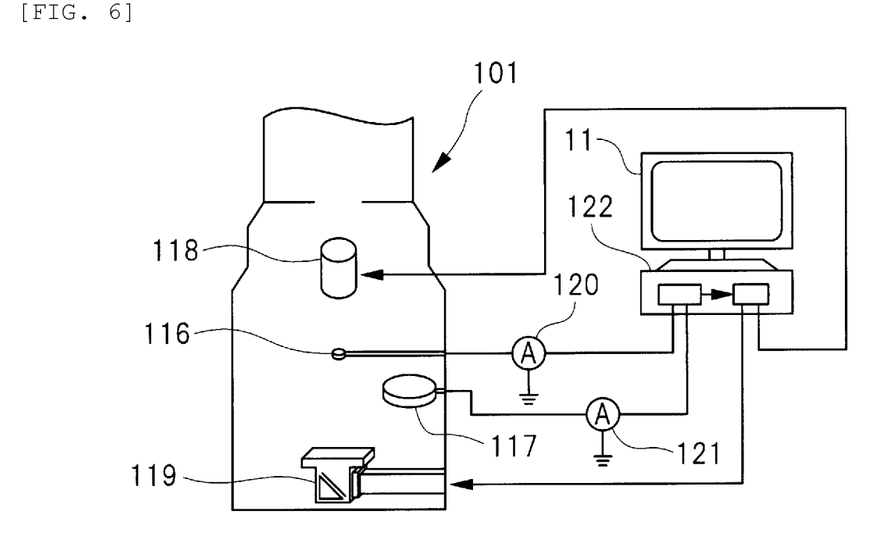
FIG. 6 is a schematic diagram illustrating a procedure for using the transmission electron microscope following FIG. 5.

Next, as illustrated in FIG. 6, the fluorescent screen 117 is pulled out from the irradiation region of the electron beams while the mask 116 is inserted in the irradiation region of the electron beams (zero-order waves). That is, the fluorescent screen 117 is removed away from the observation field of view of the electron diffraction pattern. In other words, the fluorescent screen 117 is accommodated. Thus, the diffracted waves are emitted to the detector array 119. Subsequently, based on the value of the current value IB, the imaging conditions (exposure time or gain) of the detector array 119 are automatically adjusted by the computer 122. Thereafter, the electron diffraction pattern is captured by the detector array 119. The electron diffraction pattern captured by this manner is a still image. As described above, imaging using the transmission electron microscope can be performed.

Figure 7:
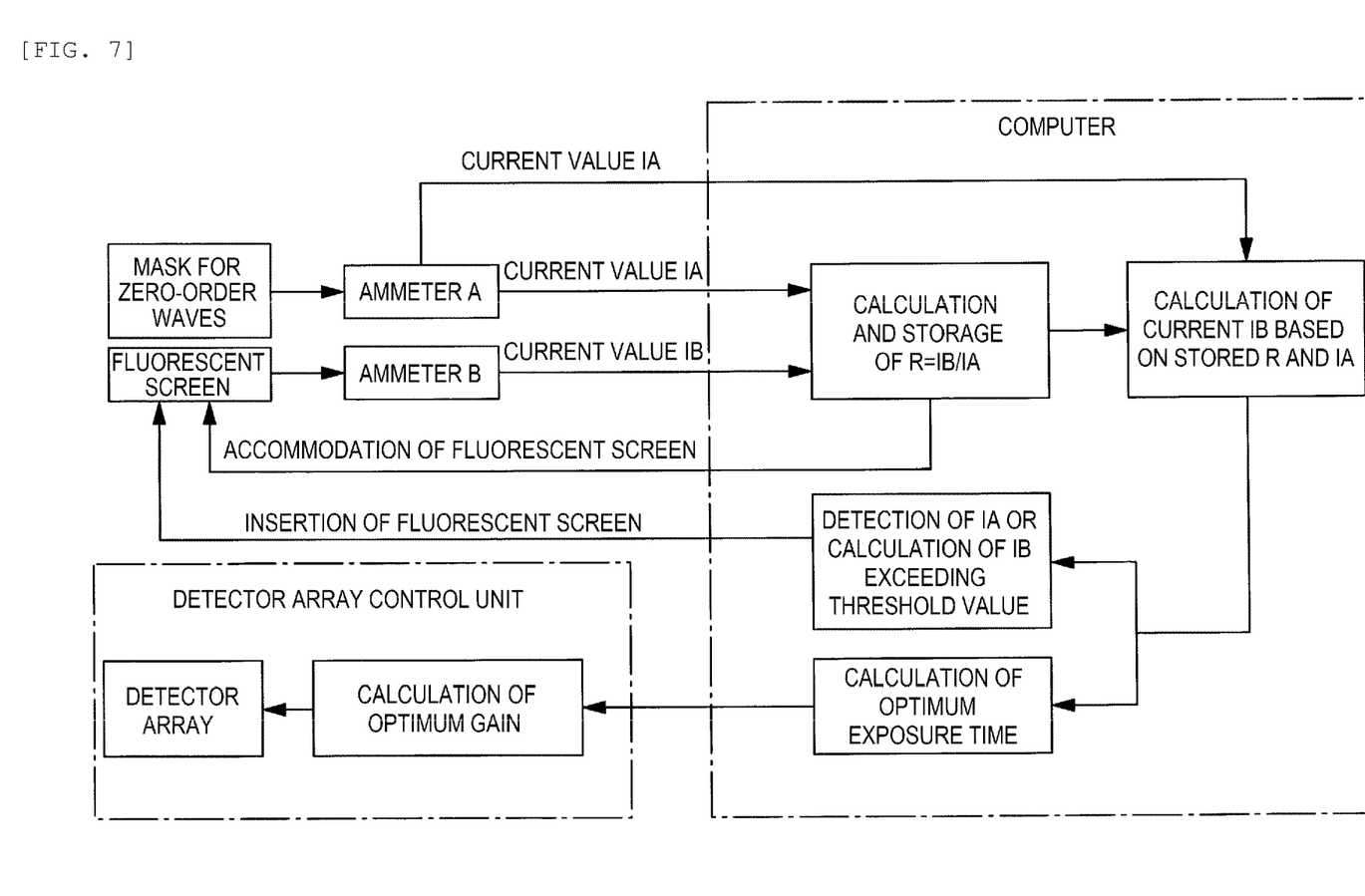
FIG. 7 is a functional block diagram illustrating operations of the transmission electron microscope according to the embodiment of the invention and a computer.

Hereinafter, operations of automatically adjusting the imaging conditions of the fluorescent screen detector array 118 and the detector array 119 will be described with reference to FIG. 7. FIG. 7 illustrates a functional block diagram illustrating operations when the electron diffraction pattern is captured by using the transmission electron microscope of the present embodiment and the computer. In FIG. 7, operations performed by the computer 122 (see FIG. 1) and operations performed by a detector array control unit are surrounded by dash-dotted lines. The detector array control unit is, for example, a device that controls the imaging conditions of the detector array 119 (see FIG. 1).

In the imaging of the electron diffraction pattern, first, the electron diffraction pattern is projected onto the fluorescent screen 117 (see FIG. 4). Subsequently, in the image projected on the fluorescent screen 117, the main spots are masked by the mask 116 that can be inserted or pulled out (see FIG. 5). That is, by inserting the mask 116, the zero-order waves are shielded.

Next, based on measured values including the current value IA of the zero-order waves measured by the current detection meter 120 and the current value IB measured by the current detection meter 121, a ratio R of the current values is calculated by the following Formula 1, and the computer 122 stores the value of the ratio of the current values.

$$R=IB/IA \quad \text{(Formula 1)}$$

Next, the fluorescent screen 117 is removed away from the observation field of view of the electron diffraction pattern (see FIG. 6). Since the fluorescent screen 117 is pulled out here, the current value IB cannot be continuously measured. Nevertheless, based on the ratio R of the current values stored in the computer 122 and the current value IA continuously measured by the current detection meter 120, the computer 122 can calculate the current value IB of the diffraction spots in real time.

The computer 122 automatically adjusts the imaging conditions (exposure time or gain) of the detector array 119 based on the current value IB calculated in this manner. That is, the imaging conditions of the detector array 119 are adjusted based on an output of the current detector 201 (see FIG. 1). Thereafter, the electron diffraction pattern is captured by the detector array 119. Specifically, the computer 122 calculates an optimum exposure time based on the current value IB, and when brightness, which is an imaging condition, is not sufficient only by adjusting the exposure time, the detector array control unit calculates an optimum gain of the detector array and adjusts the gain of the detector array. This operation will be described below with reference to FIGS. 10 and 11.

Figure 10:
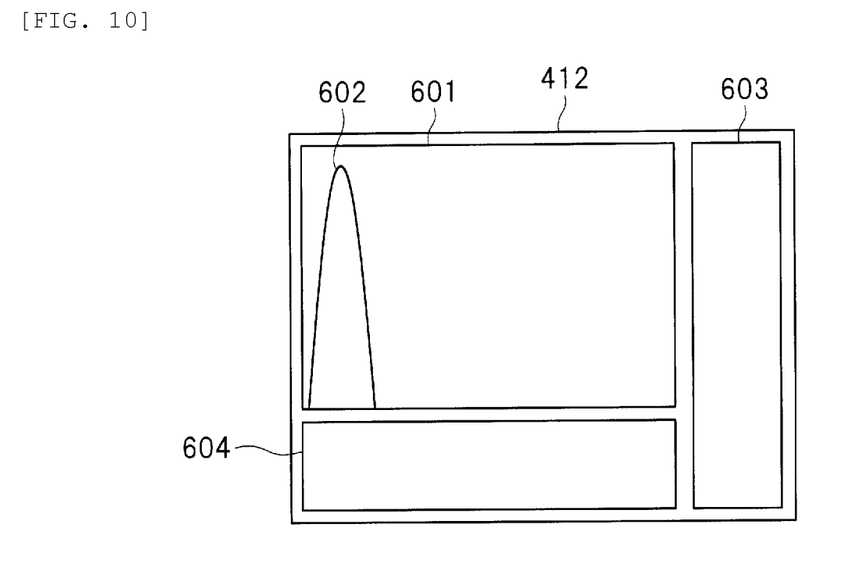
FIG. 10 is an enlarged view of a camera setting field displayed on the screen of FIG. 9.
Figure 11:
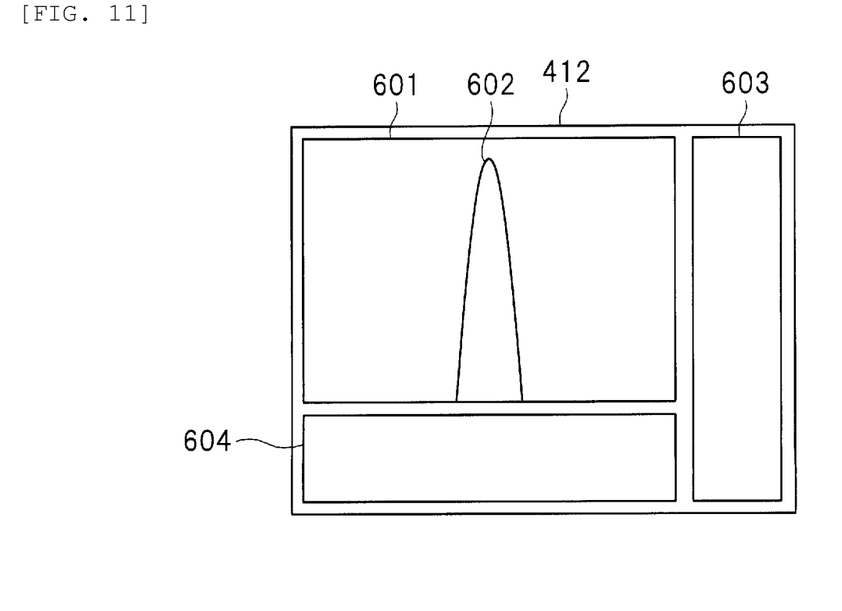
FIG. 11 is an enlarged view of the camera setting field displayed on the screen of FIG. 9.

A camera control field 603 is displayed on a right side in a camera setting field 412, and a histogram display area 601 and an image display mode selection field 604 are displayed, in an order from the top, on a left side of the camera control field 603 of FIGS. 10 and 11.

The imaging conditions of the detector array and an upper limit of the exposure time differ depending on the detector array. However, for example, by adjusting the exposure time or gain of the detector array such that a histogram 602 as illustrated in FIG. 10 becomes the histogram 602 as illustrated in FIG. 11, the imaging can be performed under optimum conditions. FIGS. 10 and 11 each illustrates an enlarged diagram of the camera setting field 412 displayed on a screen of FIG. 9. The histogram 602 in which the number of pixels is represented on a Y-axis and illuminance is represented on an X-axis is displayed on the histogram display area of FIGS. 10 and 11.

That is, as illustrated in FIG. 11, the exposure time of the detector array is adjusted such that a maximum value (peak) of the number of pixels illustrated on the Y-axis in the histogram 602 displayed in the camera setting field 412 is at a center of the illuminance illustrated on the X-axis. When the peak of the histogram cannot be moved to the center of the X-axis even when the exposure time is maximized, the histogram can be centered by increasing the gain value of the detector array (camera), which makes it possible to perform imaging with appropriate brightness. In the present embodiment, by automatically performing such adjustments based on the calculated current value IB, an accurate electron diffraction pattern can be captured with appropriate brightness. The electron diffraction pattern thus obtained can be used to examine the crystal structure data (crystal type or lattice constant) of the sample, information relating to defects or microstructures of the sample, and the like.

When the measured value of the current value IA exceeds a predetermined threshold value, or when a calculation result of the current value IB exceeds a predetermined threshold value, in order to prevent damages to the detector array, the fluorescent screen 117 is automatically inserted into the irradiation region of the electron beams.

Figure 8:
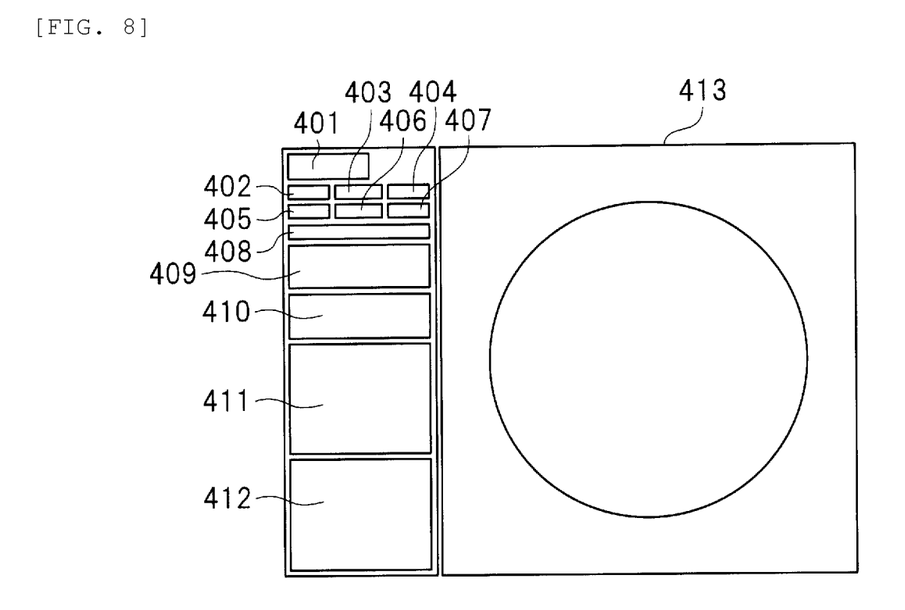
FIG. 8 is a screen displayed on a display unit when a fluorescent screen is inserted.
Figure 9:
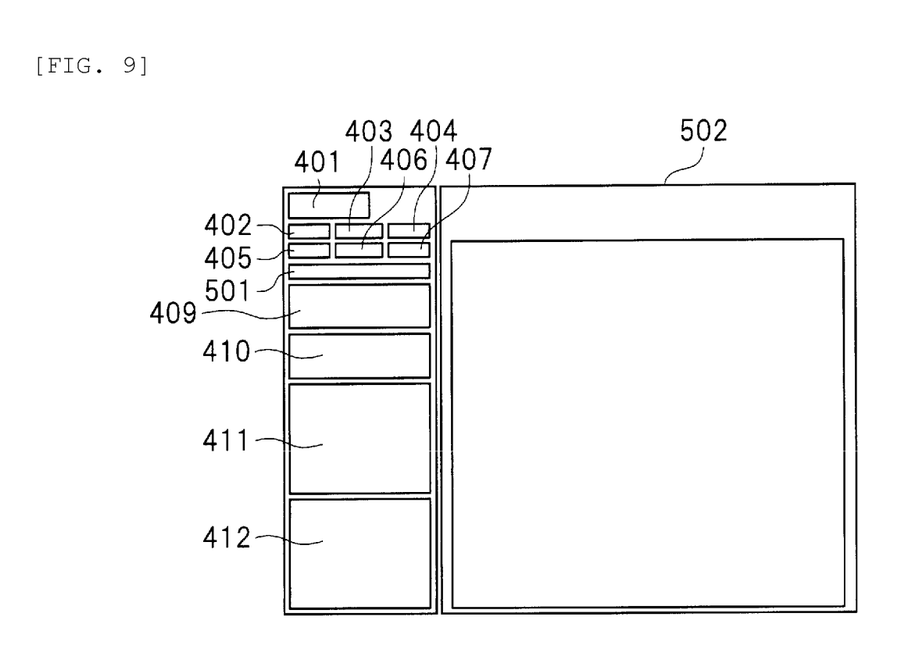
FIG. 9 is a screen displayed on a display unit when the fluorescent screen is pulled out and a mask is inserted.

Here, a screen (image) displayed on the display unit 11 of FIG. 1 when the transmission electron microscope of the present embodiment is operated will be described. FIG. 8 is an image displayed on the screen of the display unit 11 when the fluorescent screen 117 is inserted. That is, the screen illustrated in FIG. 8 is displayed on the display unit 11 when the transmission electron microscope is in the state illustrated in FIG. 4 or FIG. 5. FIG. 9 is an image displayed on the screen of the display unit 11 when the fluorescent screen 117 is pulled out and the mask 116 is inserted. That is, the screen illustrated in FIG. 9 is displayed on the display unit 11 when the transmission electron microscope is in the state illustrated in FIG. 6. A field for changing an acceleration voltage of the electron beams, a column mode, or settings of the camera or the like by an input by the operator is displayed on a part of the operation panel of FIGS. 8 and 9. That is, FIGS. 8 and 9 illustrate a graphical user interface (GUI) for using the transmission electron microscope.

As illustrated in FIG. 8, in the screen of the display unit, a fluorescent screen display area 413 is displayed on the right side, and the operation panel is displayed on the left side of the fluorescent screen display area 413. Inside the operation panel, an observation magnification display field 401, a current value IB display field 408, an acceleration voltage setting field 409, a column mode setting field 410, a stage setting field 411, and the camera setting field 412 are arranged in an order from top to bottom. Between the observation magnification display field 401 and the current value IB display field 408, a column mode display field 402, a lens mode display field 403, and an alignment mode display field 404 arranged in a horizontal direction are displayed. Between the column mode display field 402, lens mode display field 403 and alignment mode display field 404, and the current value IB display field 408, an acceleration voltage display field 405, a beam current display field 406, and a vacuum degree display field 407 arranged in the horizontal direction are displayed.

Among these display fields, for example, the acceleration voltage setting field 409, the column mode setting field 410, the stage setting field 411, and the camera setting field 412 can operate the display contents (settings) by, for example, an input unit provided in the computer 122. In the current value IB display field, the current value IB measured by the fluorescent screen 117 (see FIG. 4 or FIG. 5) is displayed. In the fluorescent screen display area 413, a live image of the fluorescent screen 117 captured by the fluorescent screen detector array 118 illustrated in FIGS. 1, 4 and 5 is displayed. Although not illustrated in FIG. 8, when the mask 116 is inserted as illustrated in FIG. 5, a current value IA display field may be displayed in the operation panel of FIG. 8.

As illustrated in FIG. 9, in the screen of the display unit, a detector array output image display area 502 is displayed on a right side, and the operation panel is displayed on a left side of the detector array output image display area 502. The display content in the operation panel is the same as that of the operation panel of FIG. 8 except that a current value IA display field 501 is displayed instead of the current value IB display field 408. The image captured by the detector array 119 illustrated in FIG. 1 is displayed in the detector array output image display area 502.

The screen illustrated in FIG. 9 is displayed on the display unit when the fluorescent screen 117 (see FIG. 6) is pulled out. Thus, the current value IB display field does not exist on the operation panel of FIG. 9, and a current value IA display field 501 illustrating the current value IA measured by the current detector 201 on the mask 116 (see FIG. 6) is displayed. As described above, in the present embodiment, even when the fluorescent screen 117 is pulled out, the strength of the electron beams can be detected based on the current value IA measured by the current detector 201 on the mask 116. Thus, as described with reference to FIG. 7, the imaging conditions of the detector array 119 can be automatically adjusted by using the computer 122. A field for displaying the current value IB which is the result calculated, as described with reference to FIG. 7, based on the ratio R of the current values and the current value IA measured in real time may be displayed in the operation panel illustrated in FIG. 9.

Effects of Present Embodiment

In the imaging of the electron diffraction patterns, a more accurate electron diffraction pattern can be obtained under optical conditions in which a wide range is irradiated with the irradiating electron beams (optical conditions in which the electron beams are spread), as compared with optical conditions in which the irradiation range of the electron beams is narrow. When the irradiation range of the electron beams are relatively wide, the entire live image displaying the surface of the fluorescent screen 117 by using the fluorescent screen detector array 118 is dark, and therefore, the operator (user) can recognize the diffraction pattern only after capturing the image after setting the exposure time to be long.

In crystal structure analysis of a sample by using the transmission electron microscope, an operation of switching between observing an image (observation of high-magnification image) and observing an electron diffraction pattern in order to determine the visual field range is frequently performed. Even if an attempt is made to adjust the magnification, camera length, aperture diameter, etc. of the transmission electron microscope while checking the live image each time such switching is performed, the live image may be dark and the adjustment may be difficult. In that case, it is conceivable to make the electron diffraction pattern visible by increasing the exposure time of the camera or increasing the gain of the camera, and to perform the adjustments. It is also conceivable to increase the strength of the electron beams in order to make it possible to visually confirm the electron diffraction pattern.

However, when the strength of the electron beams is increased, the diffraction spots become blurred, which may make it difficult to obtain the accurate electron diffraction pattern. When the fluorescent screen is pulled out and the electron diffraction pattern is captured with the exposure time of the camera, the gain of the camera, or the strength of the electron beam increased, the image obtained by the detector array (imaging camera, CCD camera) becomes excessively bright, and therefore, it is difficult to recognize the electron diffraction pattern from the image. Thus, after the adjustments are finished, it is necessary to restore the exposure time of the camera, the gain of the camera, or the strength of the electron beams. The brightness of the high-magnification image and the electron diffraction pattern to be captured in the detector array varies greatly depending on samples and the optical conditions such as the above-described magnification. Thus, when the optical conditions change, the imaging conditions of the detector array must be adjusted.

Changing the imaging conditions of such a camera is complicated and difficult for beginners. When the fluorescent screen is pulled out from the irradiation region of the electron beam in a state where the electron beams are strengthened, the scintillator of the detector array may be burnt out.

In response to this, in the present embodiment, as illustrated in FIG. 1, the current detector 201 capable of measuring the current amount of the electron beams are provided on the mask 116 that can be inserted or pulled out. Therefore, when the mask 116 is inserted, the electron beams can be detected even in the state where the fluorescent screen 117 is pulled out. By obtaining a dose of the electron beams transmitted through the sample based on the current value IA measured by the mask 116 and automatically applying the exposure time or gain corresponding to the dose of the electron beams to the detector array, it is possible to improve the convenience during imaging of the electron diffraction pattern.

That is, as described with reference to FIG. 7, first, the ratio R of the current values is calculated based on the current values IA and IB. Thereafter, since the current value IA can be detected even after the fluorescent screen 117 is pulled out, the current value IB can be calculated based on the ratio R of the current values and the current value IA. Thus, the imaging conditions of the detector array can be automatically adjusted based on the current value IB. In other words, the imaging conditions of the detector array are adjusted based on the output of the current detector 201 (see FIG. 1). In this manner, operability of the electron microscope can be improved because the imaging conditions of the camera can be automatically adjusted to an optimum state while measuring the strength of the electron beams in real time. That is, the operation for imaging using the transmission electron microscope can be simplified, and even a beginner can easily use the transmission electron microscope.

Here, when the measured value of the current value IA exceeds a predetermined threshold value, or when the calculation result of the current value IB exceeds a predetermined threshold value, the fluorescent screen 117 is automatically inserted into the irradiation region of the electron beams. This makes it possible to prevent the scintillator of the detector array from being burnt out which is caused by pulling out the fluorescent screen 117 in the state where the electron beams are strengthened. That is, the reliability of the transmission electron microscope can be improved.

<Modification>

Figure 12:
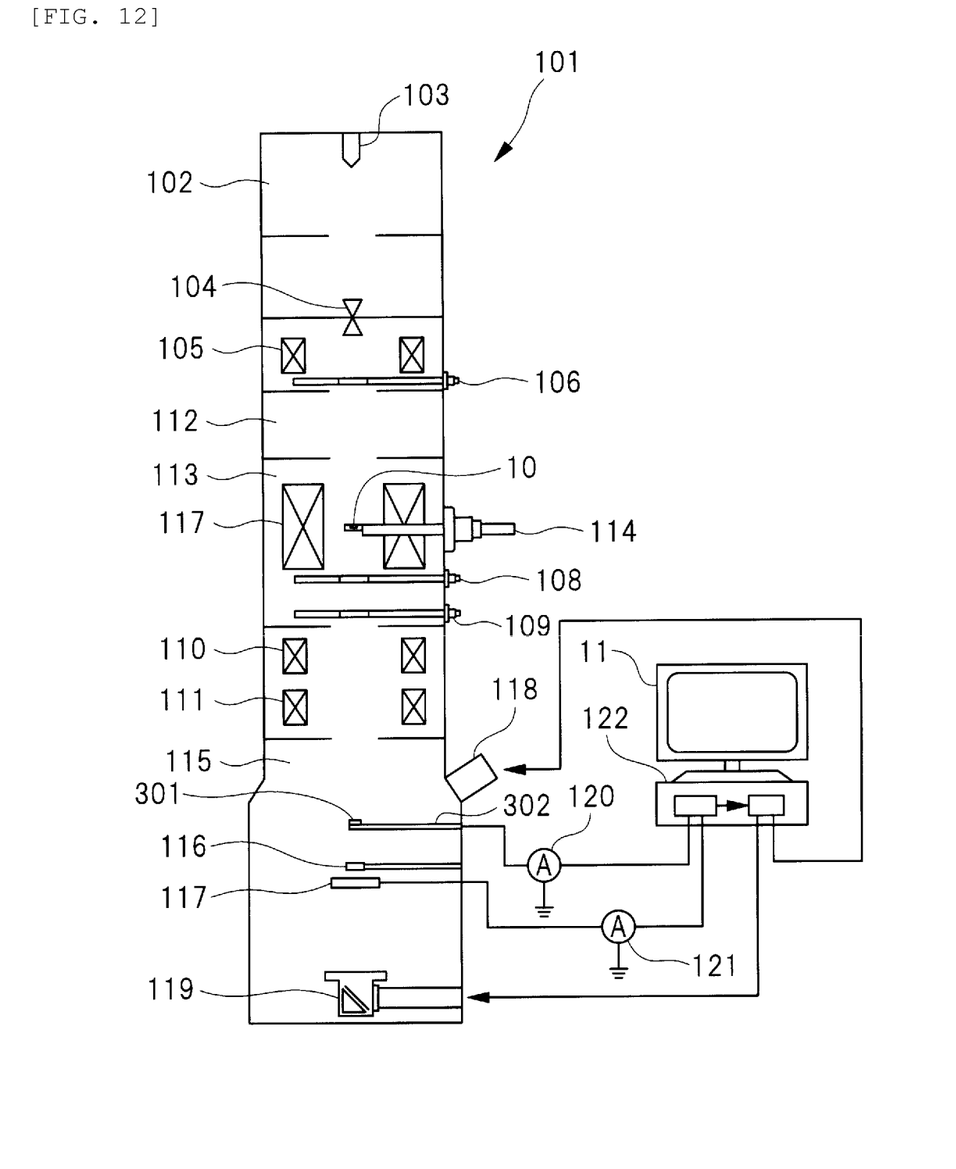
FIG. 12 is a schematic diagram illustrating a configuration of a transmission electron microscope according to a modification of the embodiment of the invention.
Figure 13:
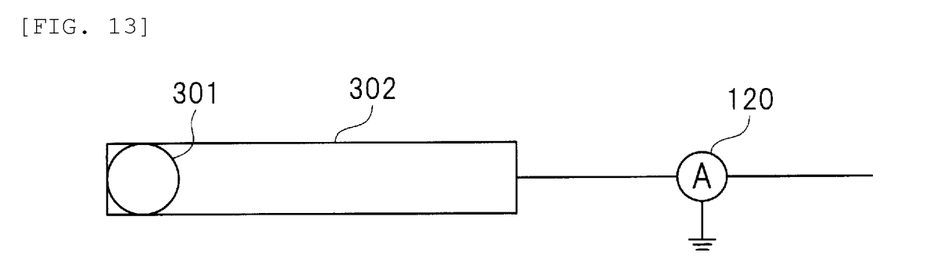
FIG. 13 is a schematic view illustrating a current detection unit constituting the transmission electron microscope according to the modification of the embodiment of the invention.
Figure 14:
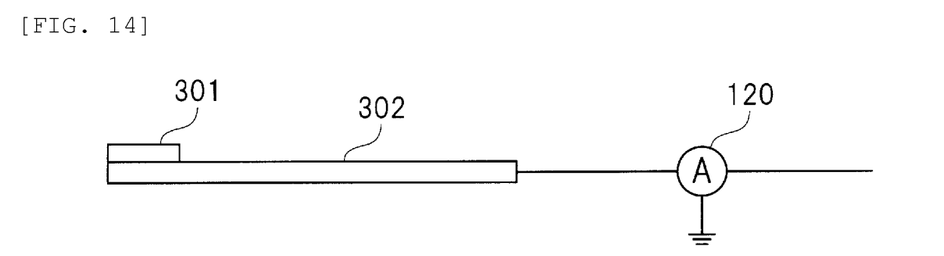
FIG. 14 is a schematic view illustrating the current detection unit constituting the transmission electron microscope according to the modification of the embodiment of the invention.

A transmission electron microscope according to a modification of the present embodiment will be described with reference to FIGS. 12 to 14. FIG. 12 illustrates a schematic diagram of the transmission electron microscope as in FIG. 1. FIGS. 13 and 14 are schematic views illustrating a current detection unit constituting the transmission electron microscope. A plan view of the current detection unit is shown in a part of FIG. 13, and a cross-sectional view of the current detection unit is illustrated in a part of FIG. 14.

As illustrated in FIG. 12, the present modification is different from the transmission electron microscope described with reference to FIGS. 1 to 11, in which the current detector is not mounted on the mask 116, and the current detector (current detection unit) 301 is disposed above the mask 116 at a position away from the mask 116. That is, the current detector 301 can be inserted into or pulled out from the irradiation region of the zero-order waves between the mask 116 and the sample 10 at a position away from the mask 116.

As illustrated in FIGS. 13 and 14, the current detector 301 is disposed on an end portion of a support base 302 in contact with an upper surface of the support base 302, and the current detection meter 120 is electrically connected to the current detector 301.

The current detector 301 of the present modification can be used in the same manner as the mask 116 of the transmission electron microscope described with reference to FIGS. 1 to 11. Thus, the current value IA can be detected by the current detector 301, and the same effect as that of the transmission electron microscope described with reference to FIGS. 1 to 11 can be obtained.

The invention made by the present inventors has been specifically described above based on the embodiments, but the invention is not limited to the embodiments described above, and various changes and modifications may be made without departing from the scope of the invention.

REFERENCE SIGN LIST 10 sample
11 display unit
101 transmission electron microscope
102 lens barrel
103 electron gun
104 gun valve
105 condenser lens
106 focused area aperture
107 objective lens
108 objective aperture
109 selected area aperture
110 intermediate lens
111 projection lens
112 intermediate chamber
113 sample chamber
114 sample table
115 observation chamber
116 mask
117 fluorescent screen
118 fluorescent screen detector array
119 detector array
120, 121 current detection meter
122 computer
201, 301 current detector

The invention claimed is:

1. A transmission electron microscope, comprising:
   an electron gun configured to emit an electron beam;
   a detector on which an electron diffraction pattern is projected;
   a sample table on which a sample is placed; and
   a mask for zero-order waves configured to be inserted into or pulled out from between the sample table and the detector, wherein
   the zero-order waves are detected in a state where the mask is inserted,
   the zero-order waves are detected by using a current detector provided on the mask, and
   an imaging condition of the detector is adjusted based on an output of the current detector.

2. The transmission electron microscope according to claim 1, wherein
   the current detector is fixed on an upper surface of the mask.

3. The transmission electron microscope according to claim 1, wherein
   the current detector is configured to be inserted into or pulled out from between the sample table and the mask at a position separated from the mask.

4. The transmission electron microscope according to claim 1, wherein
   the imaging condition includes an exposure time or a gain of the detector.

5. The transmission electron microscope according to claim 1 further comprising:
   a fluorescent screen configured to be inserted into or pulled out from a region where the electron diffraction pattern is projected.

6. The transmission electron microscope according to claim 5, wherein
   when the output of the current detector exceeds a threshold value, the fluorescent screen is inserted into the region where the electron diffraction pattern is projected.

7. The transmission electron microscope according to claim 1, wherein
   a control unit provided outside the transmission electron microscope is configured to adjust the imaging condition based on the output of the current detector.

8. The transmission electron microscope according to claim 7 further comprising:
   a fluorescent screen configured to be inserted into or pulled out from a region where the electron diffraction pattern is projected, and to detect a current of the electron beam, wherein
   the control unit is configured to store a ratio of a second current value output from the fluorescent screen to a first current value output from the current detector, and to adjust, in a state where the fluorescent screen is pulled out from the region where the electron diffraction pattern is projected, the imaging condition based on the second current value which is calculated based on the first current value and the ratio.

9. The transmission electron microscope according to claim 1, wherein
   a current value output from the current detector is displayed on a display unit provided outside the transmission electron microscope.

10. An imaging method to be used in a transmission electron microscope including:
- an electron gun configured to emit an electron beam,
- a detector on which an electron diffraction pattern is projected,
- a sample table on which a sample is placed, and
- a mask for zero-order waves configured to be inserted into or pulled out from between the sample table and the detector, the imaging method comprising:
- a step (a) of detecting the zero-order waves in a state where the mask is inserted, wherein a current detector provided on the mask and configured to detect the zero-order waves are further provided, and the imaging method further comprises:
- a step (b) of adjusting an imaging condition of the detector based on an output of the current detector; and
- a step (c) of imaging the electron diffraction pattern after the step (b).

11. The imaging method according to claim 10, wherein the transmission electron microscope further includes a fluorescent screen configured to be inserted into or pulled out from a region where the electron diffraction pattern is projected, and the step (b) comprises:
- a step (b1) of storing, into a control unit installed outside the transmission electron microscope, a ratio of a second current value output from the fluorescent screen inserted in the region where the electron diffraction pattern is projected to a first current value output from the current detector; and
- a step (b2) of pulling out the fluorescent screen from the region where the electron diffraction pattern is projected and adjusting the imaging condition based on the second current value which is calculated based on the first current value and the ratio.

12. The imaging method according to claim 10, wherein the transmission electron microscope further includes:
- a current detector provided on the mask and configured to detect the zero- order waves; and
- a fluorescent screen configured to be inserted into or pulled out from a region where the electron diffraction pattern is projected, and the imaging method further comprises:
- a step (d) of inserting the fluorescent screen into the region where the electron diffraction pattern is projected when an output of the current detector exceeds a threshold value.

\* \* \* \* \*